(12) United States Patent
Park et al.

(10) Patent No.: US 8,737,112 B2
(45) Date of Patent: May 27, 2014

(54) RESISTIVE MEMORY DEVICES, INITIALIZATION METHODS, AND ELECTRONIC DEVICES INCORPORATING SAME

(75) Inventors: Chul Woo Park, Yongin-si (KR); In Gyu Baek, Seoul (KR); Dong Hyun Sohn, Hwaseong-si (KR); Hong Sun Hwang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 307 days.

(21) Appl. No.: 13/238,669

(22) Filed: Sep. 21, 2011

(65) Prior Publication Data
US 2012/0099364 A1 Apr. 26, 2012

(30) Foreign Application Priority Data

Oct. 26, 2010 (KR) ........................ 10-2010-0104553

(51) Int. Cl.
*G11C 11/00* (2006.01)
(52) U.S. Cl.
USPC .......................................................... 365/148
(58) Field of Classification Search
USPC ............ 365/46, 94, 100, 129, 148, 158, 163; 257/2–5, 9, 310, E21.35; 438/95, 96, 438/135, 166, 240, 365, 482, 486, 597, 785
See application file for complete search history.

(56) References Cited

U.S. PATENT DOCUMENTS

| | | | |
|---|---|---|---|
| 7,345,908 B2 | 3/2008 | Hachino et al. | |
| 7,379,328 B2 | 5/2008 | Osada et al. | |
| 7,613,038 B2 | 11/2009 | Takemura et al. | |
| 2006/0120138 A1* | 6/2006 | Liaw et al. | 365/149 |
| 2007/0115714 A1* | 5/2007 | Muraoka et al. | 365/148 |
| 2010/0219392 A1* | 9/2010 | Awaya et al. | 257/3 |
| 2010/0271860 A1* | 10/2010 | Muraoka et al. | 365/148 |

FOREIGN PATENT DOCUMENTS

| | | |
|---|---|---|
| JP | 2005-260014 | 9/2005 |
| JP | 2007-026492 | 2/2007 |
| JP | 2009-187658 | 8/2009 |
| KR | 1020050052375 A | 6/2005 |
| KR | 1020050091902 A | 9/2005 |
| KR | 1020070008462 A | 1/2007 |

* cited by examiner

*Primary Examiner* — Harry W Byrne
(74) *Attorney, Agent, or Firm* — Volentine & Whitt, PLLC

(57) ABSTRACT

A resistive memory device and method of initialization are provided. The resistive memory device includes a first group of resistive memory cells connected between bit lines and a first plate and a second group connected between bit lines and a second plate. First and second initialization voltages are respectively applied to the first and second plates outside a normal path associated with a normal operation of the resistive memory cells.

11 Claims, 18 Drawing Sheets

RESISTIVE MEMORY DEVICES, INITIALIZATION METHODS, AND ELECTRONIC DEVICES INCORPORATING SAME

CROSS-REFERENCE TO RELATED APPLICATIONS

This application claims priority under 35 U.S.C. §119(a) to Korean Patent Application No. 10-2010-0104553 filed on Oct. 26, 2010, the subject matter of which is hereby incorporated by reference.

BACKGROUND OF THE INVENTION

Embodiments of the present inventive concept relate to resistive memory devices, and more particularly, to a resistive memory device initializing a resistive memory cell using at least one initialization path without affecting a normal path. Embodiments of the inventive concept also relate to initialization methods for resistive memory devices and electronic devices including resistive memory devices.

The resistance of a resistor element within a resistive memory cell (a "memory resistor") may be varied in accordance with a voltage or current supplied to the memory resistor. Using this resistance variability, a resistive memory cell may be adapted to store information correlated with different memory resistor states. The Phase change Random Access Memory (PRAM) uses one or more constituent phase change materials and particular applications of voltage/current to define two or more resistance states, where each resistance state is indicative of a corresponding stored data value.

The Magneto-resistive Random Access Memory (MRAM) uses a difference between magnetic spin directions for a magnetic pinned layer and a magnetic free layer to define an aligned state or an unaligned state. These differing magnetically induced resistance states may be correlated with respective data values.

Oxide semiconductors, such as the nickel oxide (NIO) semiconductors, analogously define resistance differences related to a thin filament formed inside the oxide, and the Conductive Bridging Random Access Memory (CBRAM) defines resistance difference related to an accumulation of ions.

In each of the foregoing memory technologies, a particular memory cell may be variously placed into one of a number of possible states (e.g., a set state, reset state, program state, erase state, etc.) Corresponding memory system operations (e.g., a program operation, erase operation, write operation, etc.) are used to create the voltage/current conditions necessary to place the resistive memory cell into the desired state. As is conventionally understood, many resistive memory cells may be placed into a so-called "initialization state." In the context of binary resistive memory cells, the initialization state is a third type of state different from the high resistance state or a low resistance state used to store data.

For example, the filament type resistive random access memory (RRAM) varies memory cell resistance according to the placement of a filament within an oxide. In order to initialize the filament type RRAM for use, the filament must be initially formed inside the oxide after fabrication. To do this, an initialization operation (or a "forming") is executed on the RRAM. However, as provided from the manufacturer, and prior to memory cell forming, the resistance of memory cells in the RRAM is much greater than the high resistance state thereafter used to indicate a particular data state. Hence, before the forming or initialization operation is executed, resistive memory cells will be in an initialization state and will exhibit corresponding operating characteristics. Thus, the execution of one or more initialization operations must necessarily occur prior to the delivery of a memory system including resistive memory cells.

The foregoing examples (PRAM, MRAM, RRAM, CBRAM) are just that—examples. Those skilled in the art understand that considerable research is on-going in the field of resistive memories and it is highly likely that other types of resistive memories will emerge in the near future. However, despite the fact that resistive memories will vary by structure and operating principles, initialization will remain an essential part of the processes required to provide a working resistive memory system.

This being the case, it should further be noted that the initialization of a resistive memory typically requires a voltage/current (e.g., around 3V) that is much greater than the voltage/current (e.g., around 1V) used during a program or write operation. This unique initialization operation requirement is particularly burdensome from a design standpoint, since initialization will usually be performed only once during a testing phase for the resistive memory prior to customer delivery. In addition to using a much greater "initialization voltage" (as compared with a program voltage), the initialization operation applies the initialization voltage to resistive memory cells for a time period much greater than a normal programming time period. In combination, these operating requirements singularly driven by the one-time-executed, but essential initialization operation tend to force an over-design of the constituent resistive memory and otherwise consume memory system resources, both hardware and software.

SUMMARY OF THE INVENTION

In one embodiment, the inventive concept provides a resistive memory device comprising; a memory cell array arranging resistive memory cells according to a plurality of word lines and a plurality of bit lines, wherein a first group of resistive memory cells is connected between the plurality of bit lines and a first plate and a second group of resistive memory cells is connected between the plurality of bit lines and a second plate, a first initialization pad that receives a first initialization voltage from an initialization device external to the resistive memory device and provides the first initialization voltage to the first plate during an initialization operation, and a second initialization pad that receives a second initialization voltage from the initialization device and provides the second initialization voltage to the second plate during the initialization operation, wherein the first and second initialization voltages are respectively applied to the first and second plates outside a normal path associated with a normal operation of the resistive memory cells.

In another embodiment, the inventive concept provides an electronic device comprising; a resistive memory device; and a processor controlling operation of the resistive memory device. The resistive memory device comprises; a memory cell array arranging resistive memory cells according to a plurality of word lines and a plurality of bit lines, wherein a first group of resistive memory cells is connected between the plurality of bit lines and a first plate and a second group of resistive memory cells is connected between the plurality of bit lines and a second plate, a first initialization pad that receives a first initialization voltage from an initialization device external to the resistive memory device and provides the first initialization voltage to the first plate during an initialization operation, and a second initialization pad that receives a second initialization voltage from the initialization device and provides the second initialization voltage to the second plate during the initialization operation, wherein the first and second initialization voltages are respectively applied to the first and second plates outside a normal path associated with a normal operation of the resistive memory cells.

In another embodiment, the inventive concept provides a memory card comprising; a resistive memory device, a card interface, and a memory controller controlling data exchange between the card interface and the resistive memory device. The resistive memory device comprises; a memory cell array arranging resistive memory cells according to a plurality of word lines and a plurality of bit lines, wherein a first group of resistive memory cells is connected between the plurality of bit lines and a first plate and a second group of resistive memory cells is connected between the plurality of bit lines and a second plate, a first initialization pad that receives a first initialization voltage from an initialization device external to the resistive memory device and provides the first initialization voltage to the first plate during an initialization operation, and a second initialization pad that receives a second initialization voltage from the initialization device and provides the second initialization voltage to the second plate during the initialization operation, wherein the first and second initialization voltages are respectively applied to the first and second plates outside a normal path associated with a normal operation of the resistive memory cells.

In another embodiment, the inventive concept provides a three dimensional memory device including a plurality of resistive memory devices electrically interconnected. At least one of the plurality of resistive memory devices comprises; a memory cell array arranging resistive memory cells according to a plurality of word lines and a plurality of bit lines, wherein a first group of resistive memory cells is connected between the plurality of bit lines and a first plate and a second group of resistive memory cells is connected between the plurality of bit lines and a second plate, a first initialization pad that receives a first initialization voltage from an initialization device external to the resistive memory device and provides the first initialization voltage to the first plate during an initialization operation, and a second initialization pad that receives a second initialization voltage from the initialization device and provides the second initialization voltage to the second plate during the initialization operation, wherein the first and second initialization voltages are respectively applied to the first and second plates outside a normal path associated with a normal operation of the resistive memory cells.

In another embodiment, the inventive concept provides a method of initialization for resistive memory cells in a memory cell array of a resistive memory device, wherein a first group of resistive memory cells is connected between a plurality of bit lines and a first plate and a second group of resistive memory cells is connected between the plurality of bit lines and a second plate, and the resistive memory cells are configured such that write data is written to at least one of the resistive memory cells during a normal operation, the method comprising; connecting an initialization device to the resistive memory device, and executing an initialization operation under the control of the initialization device by generating a first initialization voltage and a second initialization voltage using the initialization device, and applying the first initialization voltage to the first plate and applying the second initialization voltage to the second plate outside of a normal path used during the normal operation to write the write data to the at least one of the resistive memory cells.

BRIEF DESCRIPTION OF THE DRAWINGS

These and/or other aspects and advantages of the inventive concept will become apparent and more readily appreciated from the following description of the embodiments, taken in conjunction with the accompanying drawings of which.

DETAILED DESCRIPTION OF EMBODIMENTS

Reference will now be made to certain embodiments of the inventive concept illustrated in the accompanying drawings. Throughout the written description and drawings, like reference numbers and labels are used to denote like or similar elements. It should be noted that the inventive concept may be variously embodied and is not limited to only the illustrated embodiments.

Figure 1:
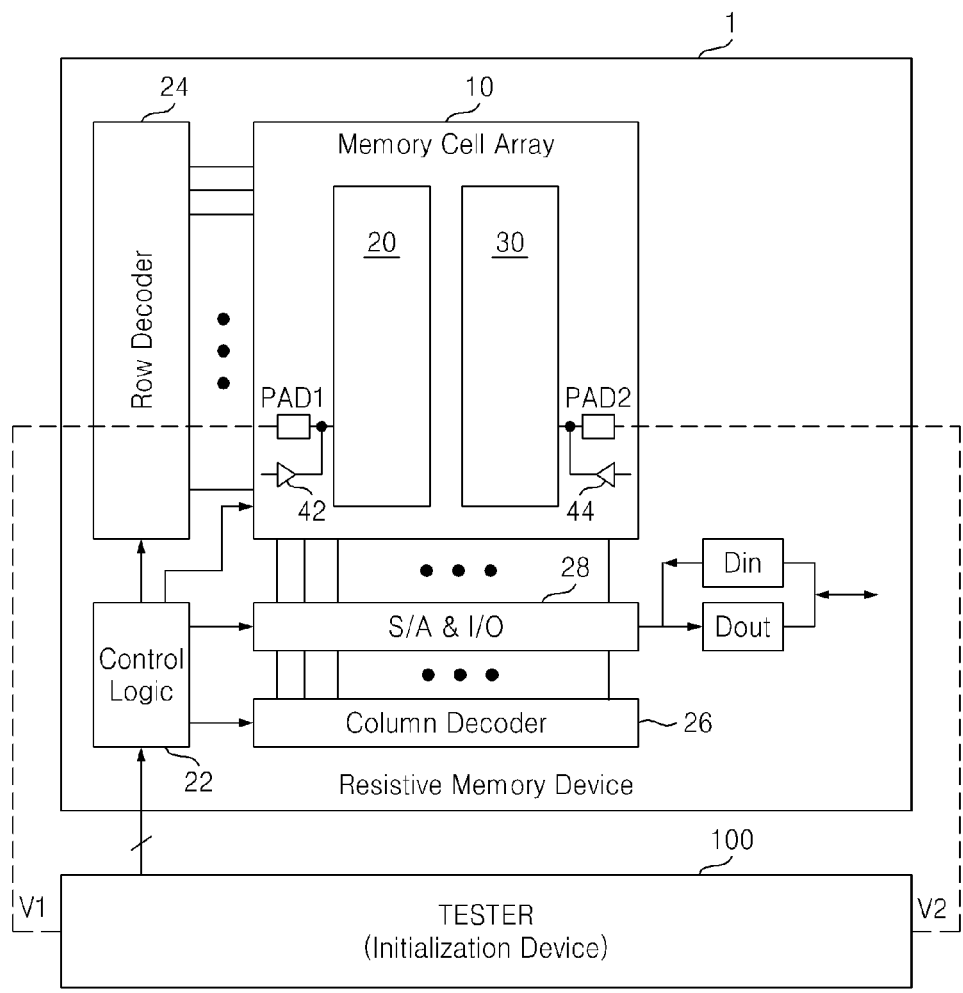
FIG. 1 is a block system diagram illustrating a resistive memory device according to an embodiment of the inventive concept connected with an initialization device.
Figure 2:
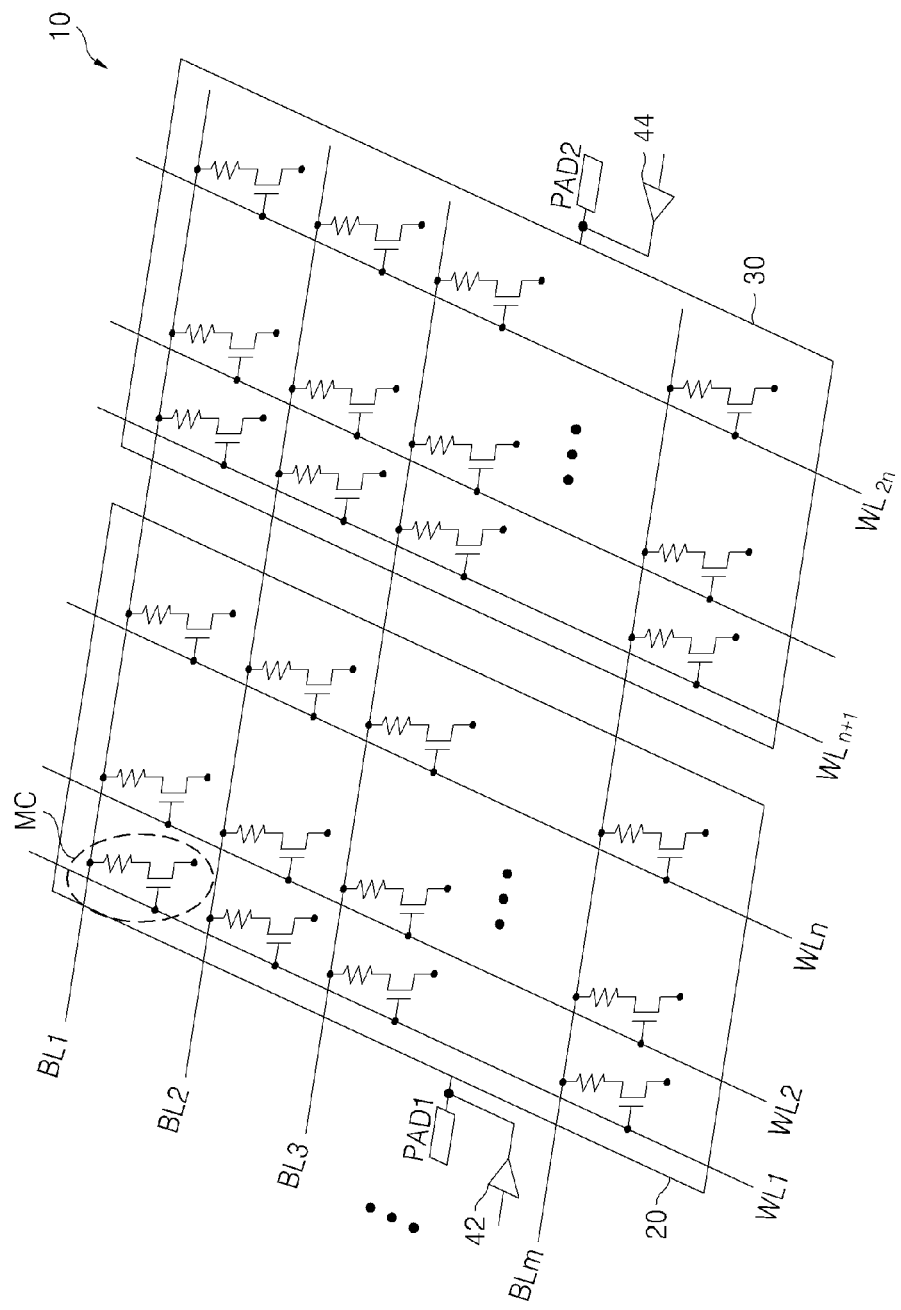
FIG. 2 illustrates one possible embodiment of a memory cell array shown in FIG. 1.

FIG. 1 is a block system diagram illustrating a resistive memory device according to an embodiment of the inventive concept connected to an initialization device. FIG. 2 is a circuit diagram further illustrating the memory cell array shown in FIG. 1 according to one embodiment of the inventive concept. Referring to FIG. 1, a resistive memory device 1 is shown connected in a system with an initialization device 100. In certain embodiments the initialization device 100 may be a tester used to execute other test operations of the type conventionally used to assure the performance of a memory device before delivery to a customer. Those skilled in the art are familiar with a range of tests routinely performed on the greater plurality of resistive memory cells arranged (e.g.,) in memory cell array 10 of the resistive memory device 1. Thus, in certain embodiments of the inventive concept, an initialization operation will be performed as part of other test operations facilitated by the use of a general tester incorporating the circuitry and related control software necessary to function as the initialization device 100.

During the initialization operation, the initialization device 100 respectively applies initialization voltages V1 and V2 to corresponding initialization pads PAD1 and PAD2 while also supplying control signals to control logic 22 associated with the resistive memory device 1. In this manner, an operation of resistive memory device components (e.g., control logic 22, row decoder 24, column decoder 26, Input/Output (I/O) and sense amplifier (SA) circuit 28, input driver (Din), output driver (Dout), etc.) necessary to execute the initialization operation is controlled by the initialization voltages V1 and V2 and control signals.

As will be conventionally appreciated, the memory cell array 10 includes a plurality of bit lines BL1 to BLm, a plurality of word lines WL1 to WL2n, and a plurality of resistive memory cells (MC). In certain embodiments of the inventive concept, each one of the plurality of resistive memory cells includes a transistor and a memory resister. Here, the term "memory resistor" denotes an element capable of indicatively storing information according to a plurality of resistance states as defined by applied voltage/current signal(s) provide by components of the resistive memory device 1.

As shown in relevant portion in FIG. 2, the source of each resistive memory cell transistor in a first group of resistive memory cells is connected to a first plate or mesh 20, and the gate of each resistive memory cell transistor is respectively connected to one of the word lines WL1 to WLn of a first group. Each memory resistor of the resistive memory cells in the first group is connected between one of the bit lines BL1 to BLm and the drain of a corresponding memory cell transistor.

The first initialization pad PAD1 is connected to the first plate 20 along with a first driver 42. During the initialization operation, the initialization device 100 supplies the first initialization voltage V1 to the first plate 20 through the first initialization pad PAD1. In certain embodiments of the inventive concept, the first plate 20 may be arranged in parallel with the plurality of bit lines BL1 to BLm. In other embodiments of the inventive concept, the first plate 20 may be arranged perpendicular to the plurality of bit lines BL1 to BLm.

The source of each resistive memory cell transistor in a second group of resistive memory cells is connected to a second plate or a mesh 30 and the gate of the each resistive memory cell transistor in the second group is respectively connected to one of the word lines WLn+1 to WL2n of the second group. Each memory resistor of resistive memory cells in the second group is connected between one of the bit lines BL1 to BLm and the drain of a corresponding resistive memory cell transistor.

A second initialization pad PAD2 is connected to the second plate 30 along with a second driver 44. During the initialization operation, the initialization device 100 may supply a second initialization voltage V2 to the second plate 30 through the second initialization pad PAD2. The first plate 20 and the second plate 30 are ready examples of many different types (arrangements) of conductor(s) that may be similarly used. As with the first plate, the second plate 30 may be arranged in parallel with, or perpendicular to, the bit lines BL1 to BLm, depending on overall memory array design.

During the initialization operation, the control logic 22 controls the operation of the row decoder 24 and the column decoder 26, as well as the operation of first driver 42 and second driver 44, albeit the overall functionality of the control logic 22 will be under control of the initialization device 100 during the initialization operation. During the initializing operation, the row decoder 24 will decode row addresses provided by the control logic 22 and generate (or cause the generation of) word line driving voltage(s) to one or more of the plurality of word lines WL1 to WLn according to a decoding result. In a similar manner, the column decoder 26 decodes column addresses provided by the control logic 22 and generates a selection signal selecting at least one of the plurality of bit lines BL1 to BLmn according to a decoding result. The sense amplifier and input/output circuit 28 senses and amplifies a signal output through at least one bit line in response to the selection signal and provides an amplified version of the signal to the output driver Dout. Moreover, the sense amplifier & input/output circuit 28 may receive and pass a signal input via the input driver Din to the at least one bit line in response to the selection signal. As is conventionally understood, the input driver Din may be used to pass input data to a data bus connected to the sense amplifier & input/output circuit 28, and the output driver Dout may be used to pass output data from the sense amplifier & input/output circuit 28 back to the data bus.

Figure 3:
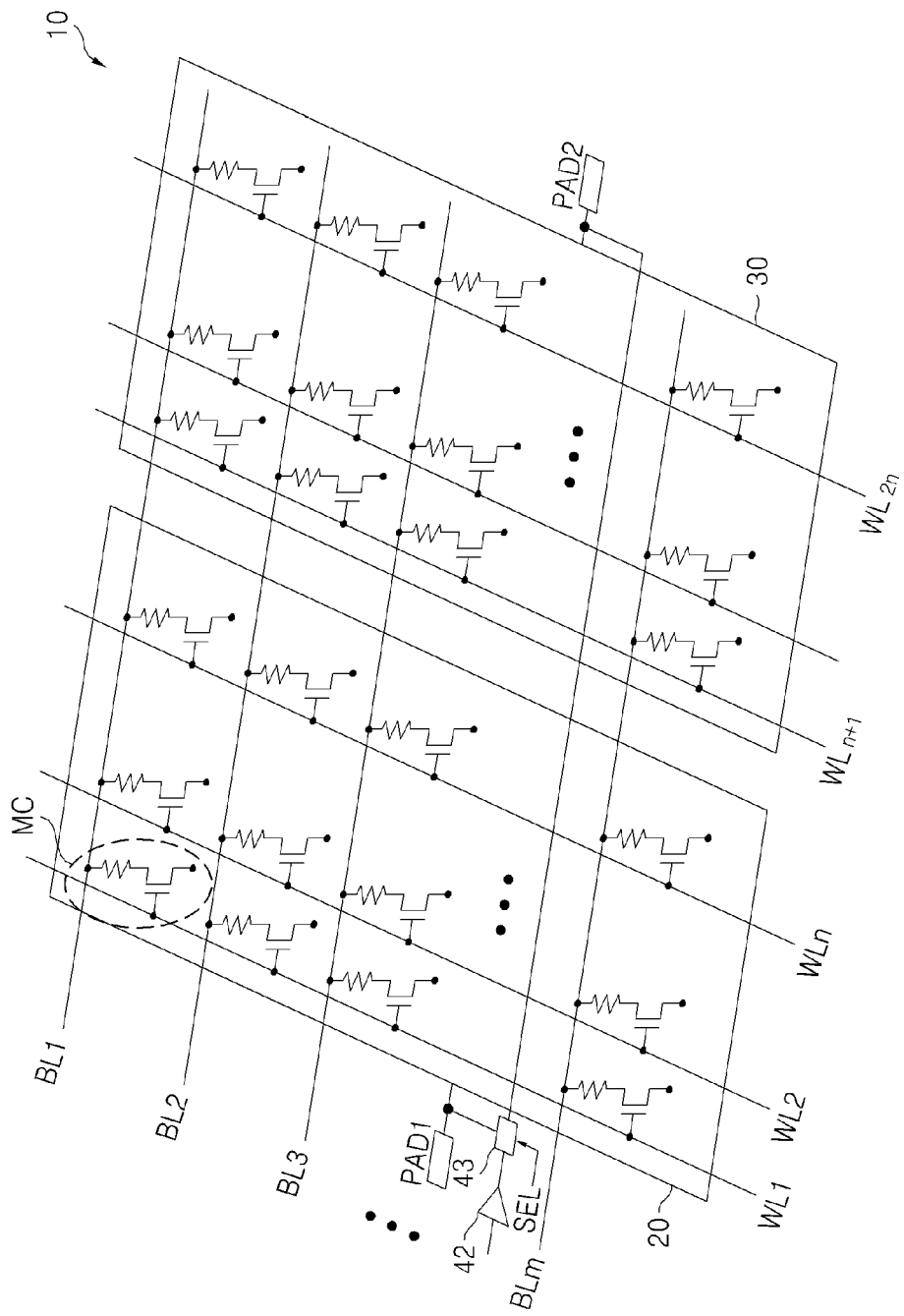
FIG. 3 illustrates another embodiment of a memory cell array shown in FIG. 1.

FIG. 3 is a circuit diagram further illustrating the memory cell array shown in FIG. 1 according to another embodiment of the inventive concept. Here, a driver 42 is enabled during a normal operation. In this context, the term "normal operation" indicates any one or more of set of operations used to program/write, read, condition, refresh, and/or erase one or more resistive memory cells in the memory cell array 10. During a normal operation, the first driver 42 may be used to generate one or more "normal voltage(s)" associated with the ongoing normal operation. A switching circuit 43 may be used to selectively apply the normal voltage generated by the driver 42 during the normal operation to either the first plate 20 or the second plate 30 according to a selection signal SEL.

During an initialization operation, the driver 42 becomes disabled under the control of the control logic 22 as directed by the initialization device 100. Then, the first initialization voltage V1 provided by the initialization device 100 may be supplied to the first plate 20 through the first initialization pad PAD1, and the second initialization voltage V2 provided by the initialization device 100 may be supplied to the second plate 30 through the second initialization pad PAD2.

Figure 4:
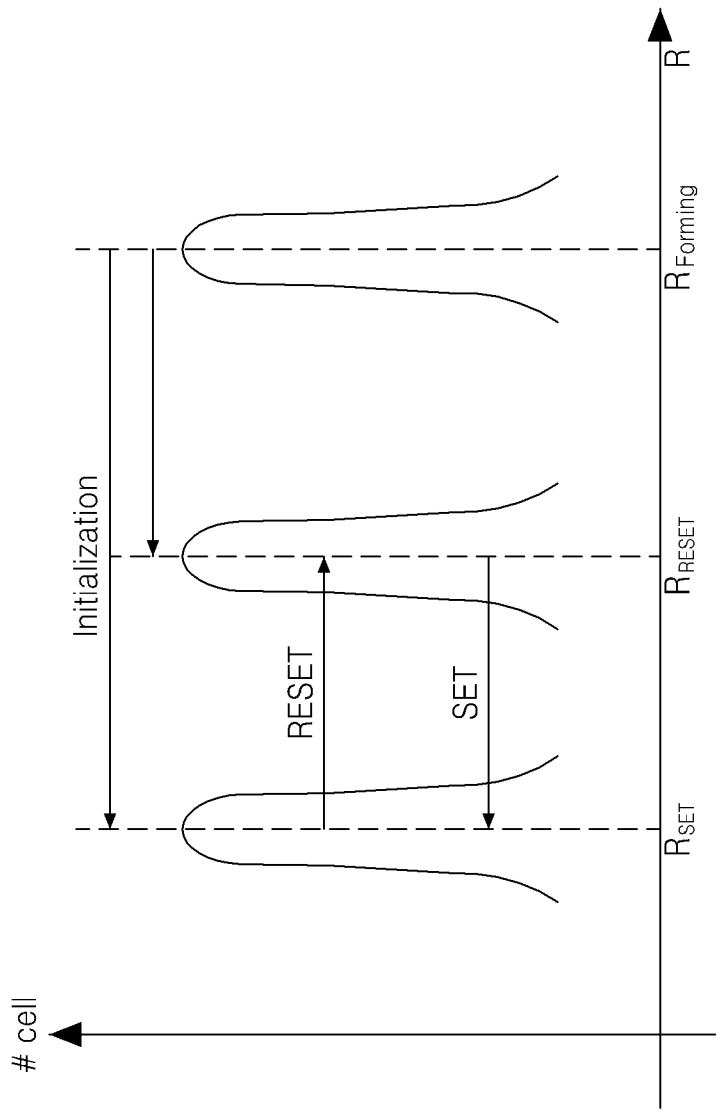
FIG. 4 is a diagram further illustrating one method of initializing a resistive memory cell.

FIG. 4 is a conceptual diagram further illustrating one method of initializing a resistive memory cell. The plot of FIG. 4 shows a number or voltage distributions corresponding to different resistive states (R) for each one of the resistive memory cells. Memory resistors of the resistive memory cells illustrated in FIGS. 2 and 3 indicate different data states according to different respective resistive states (e.g., $R_{RESET}$ for a high resistance state and resistance $R_{SET}$ for a low resistance state). For example, a normal program/write operation may be used to change the resistive state of a binary (e.g., 1-bit) resistive memory cell from the high resistance state ($R_{RESET}$) to the low resistance state ($R_{SET}$), or from the low resistance state ($R_{SET}$) to the high resistance state ($R_{RESET}$) according to the normal voltages applied to the first plate 20 or the second plate 30, and one or more bit line(s).

As shown in FIG. 4, the memory resistor of the exemplary, binary resistive memory cell may alternately be in an initialization state ($R_{Forming}$) which is typically greater than the high (or highest) resistance state (e.g., $R_{RESET}$) used during normal operations. As noted above, this resistive memory cell condition is usually associated with a newly fabricated resistive memory before it is finally tested, conditioned, and prepared for incorporation within a customer product. Before being incorporated the resistive memory device must be prepared for normal operations by changing the resistance of one or more resistive memory cells from the initialization state ($R_{Forming}$) to either the high resistance state ($R_{RESET}$) or the low resistance state ($R_{SET}$) by execution of the initialization operation. Again as noted above, the initialization operation usually involves application of relatively high voltage/current to the memory resistor of the target resistive memory cells. In addition, the initialization operation is often required to condition (or improve) one or more of the distributions of a resistive memory cell. For example, this is a process often associated with PRAM and is sometimes referred to as "a firing operation".

Since the initialization operation for the resistive memory device 1 is executed only once, it should be capable of being executed without affecting a normal path associated with each one of the resistive memory cells. In this context, the term "normal path" refers to a collection of signal lines and connected components through which a normal operation (e.g., a program/write operation) effects a change in the resistive state of a resistive memory cell. Accordingly, the resistive memory device 1 of FIG. 1 includes the first initialization pad PAD1 connected to the first plate 20 and the second initialization pad PAD2 connected to the second plate 30, whereby (and through which) the initialization operation may be executed without affecting the normal path respectively associated with each one of the constituent resistive memory cells.

Figure 5:
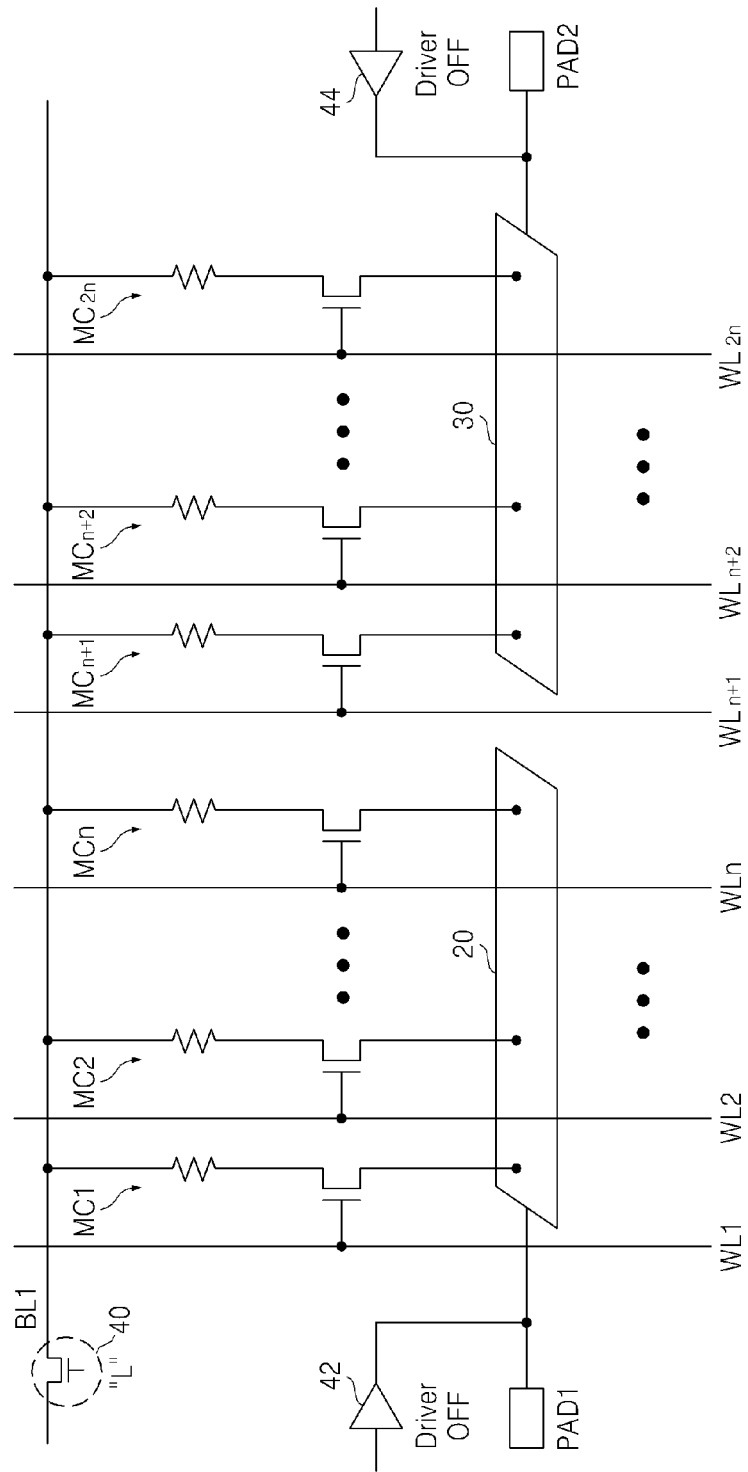
FIG. 5 is a circuit diagram further illustrating a method of initializing a resistive memory cell according to an embodiment of the inventive concept.

FIG. 5 is a circuit diagram further illustrating one method of initializing a resistive memory cell according to an embodiment of the inventive concept. Referring to FIGS. 2 and 5, a method of initializing resistive memory cells may be executed as follows. During the initialization operation, each first driver 42 and second driver 44 are disabled (i.e., turned-off) under the control of the control logic 22 (e.g., using competent control signal(s) provided by the control logic 22 in response to control signals from the initialization device 100. Additionally, a selection switch 40 connected between the sense amplifier & I/O circuit 28 and a first bit line BL1 is turned-off in response to a selection signal (e.g., a logically "low" selection signal) so as not to affect the normal path(s) of the resistive memory cells MC1-MC2n. In certain embodiments of the inventive concept, the selection switch 40 may be included within the sense amplifier & I/O circuit 28.

The first initialization voltage V1 provided by the initialization device 100 is supplied to the first plate 20 through the first initialization pad PAD1, and the second initialization voltage V2 provided by the initialization device 100 is supplied to the second plate 30 through the second initialization pad PAD2.

When a logically "high" word line driving voltage is supplied to a first word line WL1 and a $(n+1)^{th}$ word line $WL_{n+1}$, and the first initialization voltage V1 is greater than the second initialization voltage V2, a first initialization path (being a voltage and/or a current path) is formed between (e.g.) the first initialization pad PAD1, the first plate 20, a first resistive memory cell MC1 connected to the first bit line BL1, a $(n+1)^{th}$ resistive memory cell $MC_{n+1}$ also connected to the first bit line BL1, the second plate 30, and the second initialization pad PAD2. Accordingly, the first resistive memory cell MC1 and the $(n+1)^{th}$ resistive memory cell $MC_{n+1}$ commonly connected in series through the first bit line BL1 may be initialized in series according to a voltage difference between the first initialization voltage V1 and the second initialization voltage V2.

Alternately, when a high word line driving voltage is supplied to the first word line WL1 and the $(n+1)^{th}$ word line $WL_{n+1}$, and the second initialization voltage V2 is greater than the first initialization voltage V1, a second initialization path is formed between the second initialization pad PAD2, the second plate 30, the $(n+1)^{th}$ resistive memory cell $MC_{n+1}$, connected to the first bit line BL1, the first resistive memory cell MC1 also connected to the first bit line BL1, the first plate 20, and the first initialization pad PAD1. Accordingly, the $(n+1)^{th}$ resistive memory cell $MC_{n+1}$ and the first resistive memory cell MC1, commonly connected in series through the first bit line BL1, may be initialized in series according to a voltage difference between the second initialization voltage V2 and the first initialization voltage V1.

Since the first driver 42 and the second driver 44, as well as the selection switch 40 are turned-off during the initialization operation, as illustrated in FIG. 5, an initialization path is formed outside of the normal path used during normal resistive memory system operations. In this context, the phrase "outside of the normal path" means one or more bit lines receiving, at least in part, the initialization voltage during the initialization operation is cut-off (electrically isolated) from the sense amplifier and I/O circuit 28 by selection switch 40. Because the initialization path is "outside the normal path" the only source of the initialization voltage(s) applied to the first and/or second plates 20, 30 is the initialization device 100. Voltage generators on the resistive memory device 1 need not be used.

In similar manner, any memory cell in the first group connected to the first plate 20 or in the second group connected to the second plate 30 may be initialized in a serial manner. For example, a second resistive memory cell MC2 and a $(n+2)^{th}$ resistive memory cell $MC_{n+2}$ may be initialized in series, and a $n^{th}$ resistive memory cell MCn and a $2n^{th}$ resistive memory cell $MC_{2n}$ may be initialized in series.

Figure 6:
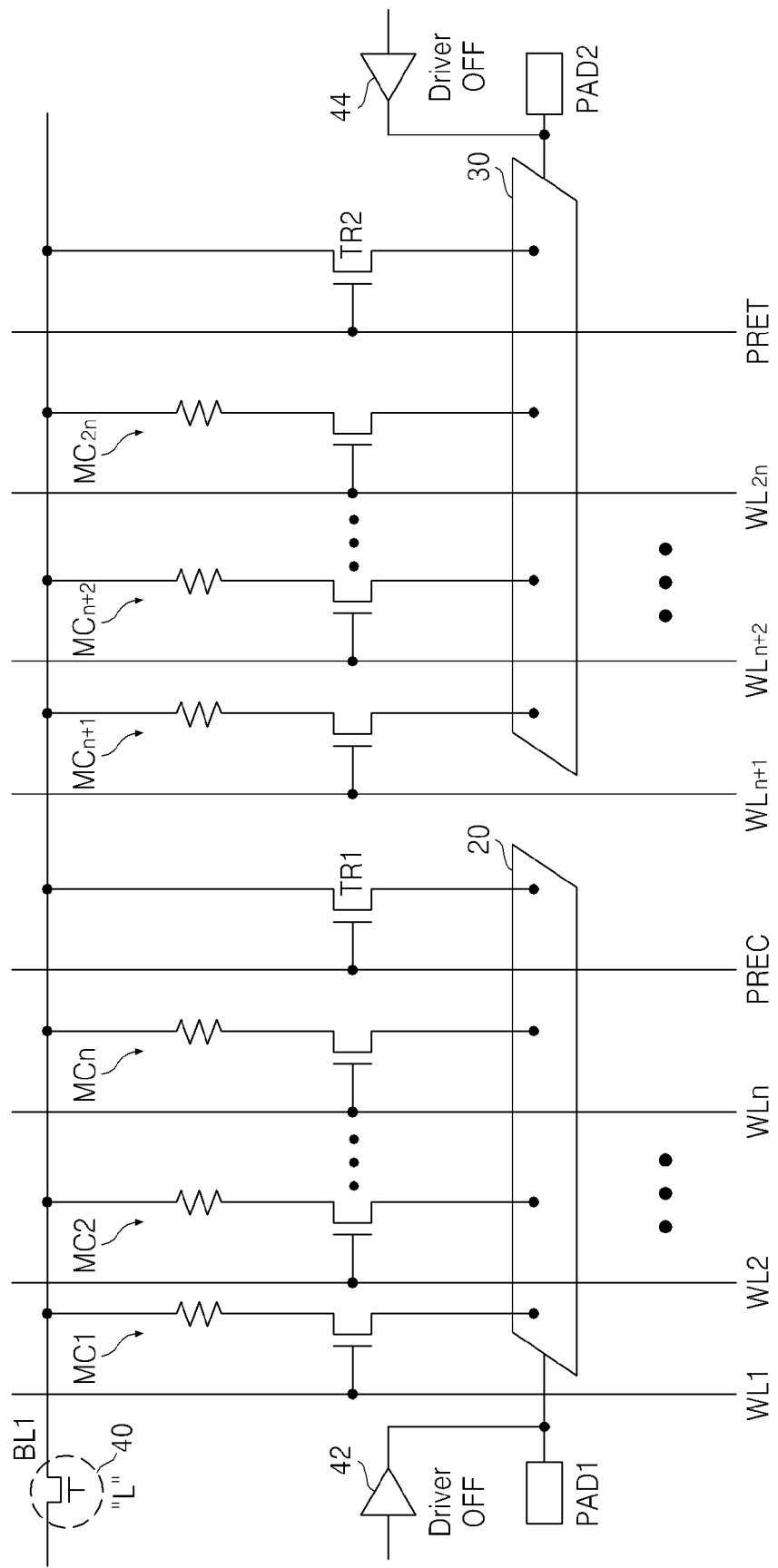
FIG. 6 is a circuit diagram further illustrating a method of initializing a resistive memory cell according to another embodiment of the inventive concept.

FIG. 6 is a circuit diagram further illustrating a method of initializing a resistive memory cell according to another embodiment of the inventive concept. The circuit diagram of FIG. 6 is the same as the circuit diagram of FIG. 5 except for the respective first transistors TR1 connecting the first plate 20 with the first bit line BL1, and the respective second transistors TR2 connecting the second plate 30 with the first bit line BL1.

With this configuration and during the initialization operation, the first and second transistors TR1 and TR2 may be operated in a complementary manner, such that a first transistor TR1 pre-charges the first bit line BL1 with the first initialization voltage V1 supplied to the first plate 20, or a second transistor TR2 pre-charges the first bit line BL1 with the second initialization voltage V2 supplied to the second plate 30. The first and second transistors T1 and T2 may also be used in conjunction the first and second drivers 42 and 44 to pre-charge a selected bit line during a normal operation.

Assuming that the first initialization voltage V1 is greater than the second initialization voltage V2, when a high word line driving voltage is successively supplied to each one of the plurality of word lines WL1 to WLn while a high second pre-charge voltage (PRET) is supplied to an NMOS transistor TR2 and a low first pre-charge voltage (PREC) is supplied to an NMOS transistor TR1, an initialization path is generated between the first initialization pad PAD1 and the second initialization pad PAD2 and the memory resistors of each resistive memory cell MC1 to MCn as successively connected to the initialization path may be initialized in turn.

Alternately, assuming that the second initialization voltage V2 is greater than the first initialization voltage V1, when a high word line driving voltage is supplied to each one of the plurality of word line WLn+1 to $WL_{2n}$ while a low second pre-charge voltage (PRET) is supplied to the NMOS transistor TR2 and a high first pre-charge voltage PREC is supplied to the NMOS transistor TR1, the initialization path is generated between the first initialization pad PAD1 and the second initialization pad PAD2 and memory resistors of each resistive memory cell $MC_{n+1}$ to $MC_{2n}$ as successively connected to the initialization path may be initialized in turn.

Yet, the foregoing approaches to resistive memory cell initialization do not require the use of the normal path associated with normal operations. No on-memory-device voltage generator need be used or provided, and the sense amplifier and I/O circuit is not connected to the memory cell array during the initialization operation.

Figure 7:
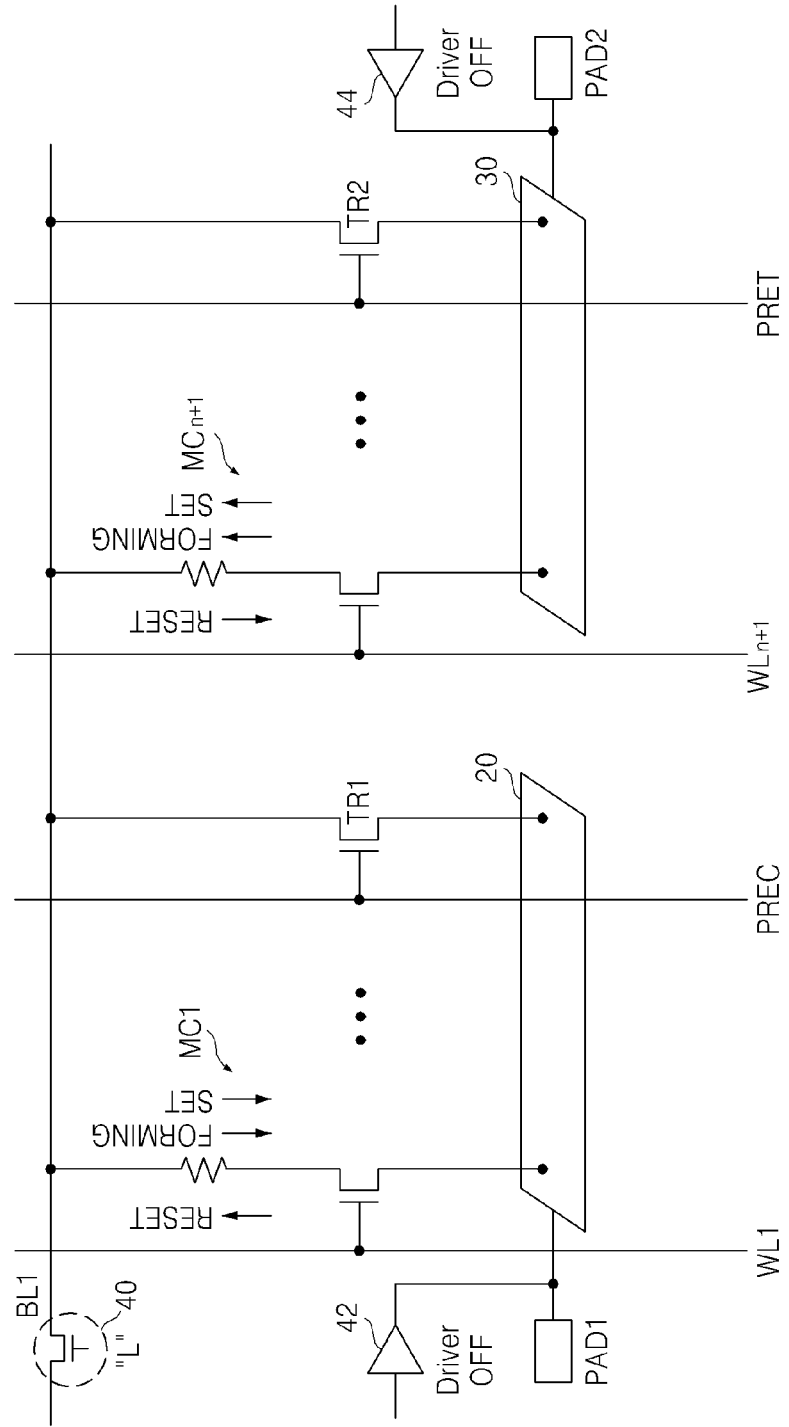
FIG. 7 is a circuit diagram further illustrating a method of initializing a resistive memory cell according to still another embodiment of the inventive concept.

FIG. 7 is a circuit diagram further illustrating a method of initializing a resistive memory cell according to still another embodiment of the inventive concept. Referring to FIG. 7, each of the first and second drivers 42 and 44 as well as the selection switch 40 is turned-off, as the first initialization voltage V1 and the second initialization voltage V2 provided directly from the initialization device 100 are respectively supplied to the first initialization pad PAD1 and the second initialization pad PAD2 during an initialization operation.

As illustrated in FIG. 7, the supply direction (arbitrarily + or −) of the voltage/current used during the initialization of resistive memory cells may be defined at will within the resistive memory cell array 10. In FIG. 7, opposite supply directions are shown in relation to the first group of resistive memory cells connected to the first plate 20 and the second group of resistive memory cells connected to the second plate 30.

Moreover, a particular supply direction for the initialization voltage/current may be used to move the resistive state of the constituent memory cells receiving the initialization voltage/current from the initialization state ($R_{Forming}$) to either one of the a reset state (RRESET) or a set state ($R_{SET}$). In the illustrated example of FIG. 7, the first group of resistive memory cells MC1 through MCn are RESET/SET in a manner opposite that (SET/RESET) of the second groups of resistive memory cells MCn+1 through MC2n.

In this case, data indicating a memory resistor of the first resistive memory cell MC1 and data indicating a memory resistor of the resistive memory cell $MC_{n+1}$ are complementary relative to one another. That is, when the $(n+1)^{th}$ resistive memory cell $MC_{n+1}$ performs a reset operation on an identical binary program data '0', e.g., indicates a reset state, the first resistive memory cell MC1 performs a set operation, e.g., indicates a set state. Contrarily, when the $(n+1)^{th}$ resistive memory cell $MC_{n+1}$ performs a set operation on an identical binary program data '1', e.g., indicates a set state, the first resistive memory cell MC1 performs a reset operation, e.g., indicates a reset state.

Accordingly, during a data read operation, when a reset state is read or determined, it may be determined that data '0' is stored in a $(n+1)^{th}$ resistive memory cell $MC_{n+1}$ and data '1' is stored in a first resistive memory cell MC1. Contrarily, when a set state is read or determined, it may be determined that data '1' is stored in the $(n+1)^{th}$ resistive memory cell $MC_{n+1}$ and data '0' is stored in the first resistive memory cell MC1. Thus, as illustrated in FIG. 7, when each resistive memory cell of a first group connected between the first bit line BL1 and the first plate 20 operates as one of a true cell and a complementary cell, each of resistive memory cells of a second group connected between the first bit line BL1 and the second plate 30 may operate as the other of the true cell and the complementary cell.

As illustrated in FIG. 7, according to whether the first initialization voltage V1 supplied to the first initialization pad PAD1 is greater than the second initialization voltage V2 supplied to the second initialization pad PAD2, an initialization voltage supply direction for each resistive memory cell of the first group connected between the first bit line BL1 and the first plate 20 and an initialization voltage supply direction for each resistive memory cell of the second group connected between the first bit line BL1 and the second plate 30 may be determined.

Figure 8:
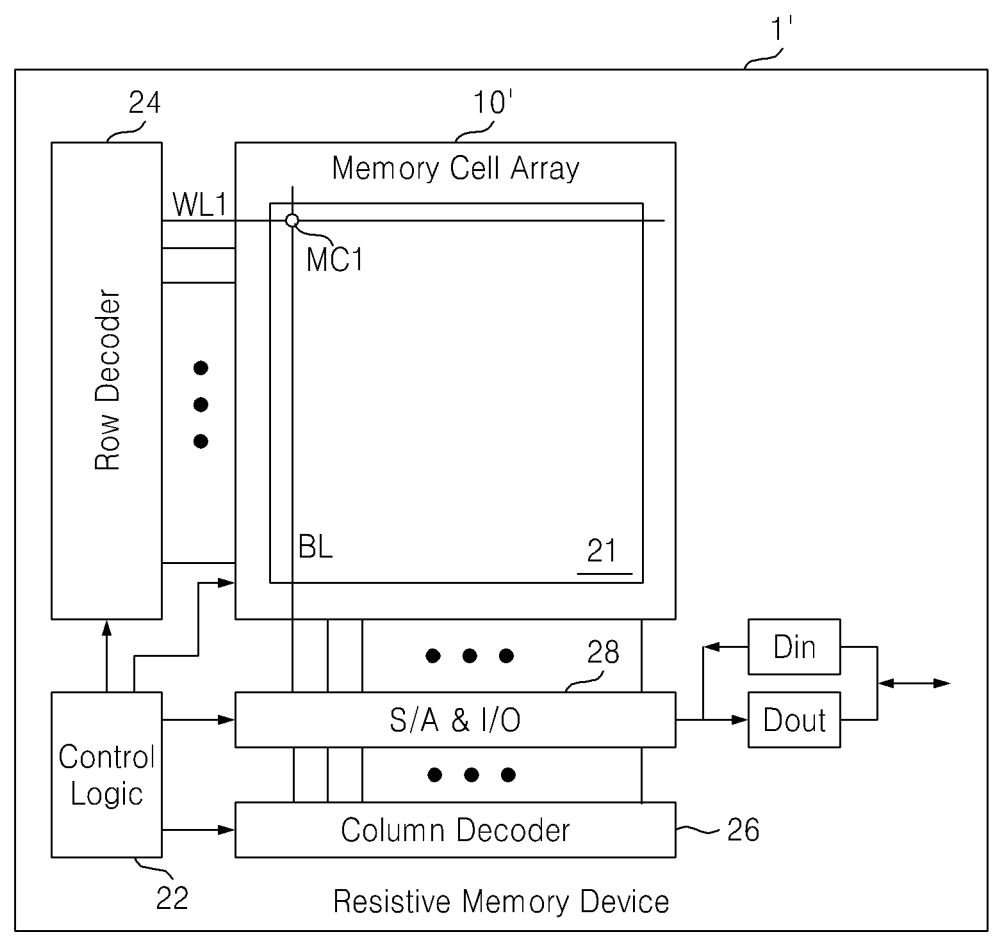
FIG. 8 is a block diagram illustrating a resistive memory device performing an initialization operation using a normal path according to an embodiment of the inventive concept.

FIG. 8 is a diagram illustrating a resistive memory device capable of performing an initialization operation using (or "inside") the normal path according to an embodiment of the inventive concept. Except that a memory cell array 10 included in the resistive memory device 1' illustrated in FIG. 8 is connected to a plate 21 or a common source line, the architecture and operation of the resistive memory device 1 of FIG. 1 and a resistive memory device 1' of FIG. 8 are substantially the same.

Figure 9:
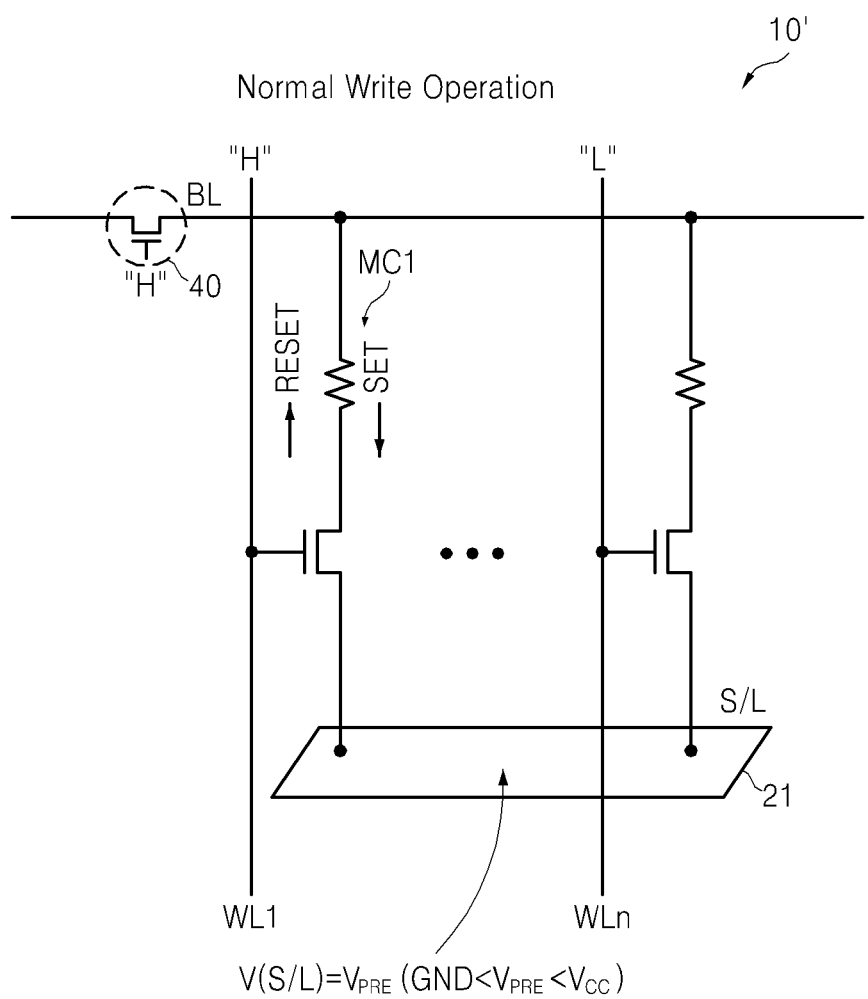
FIG. 9 is a circuit diagram illustrating a write operation performed using the normal path of the resistive memory device shown in FIG. 8.
Figure 10:
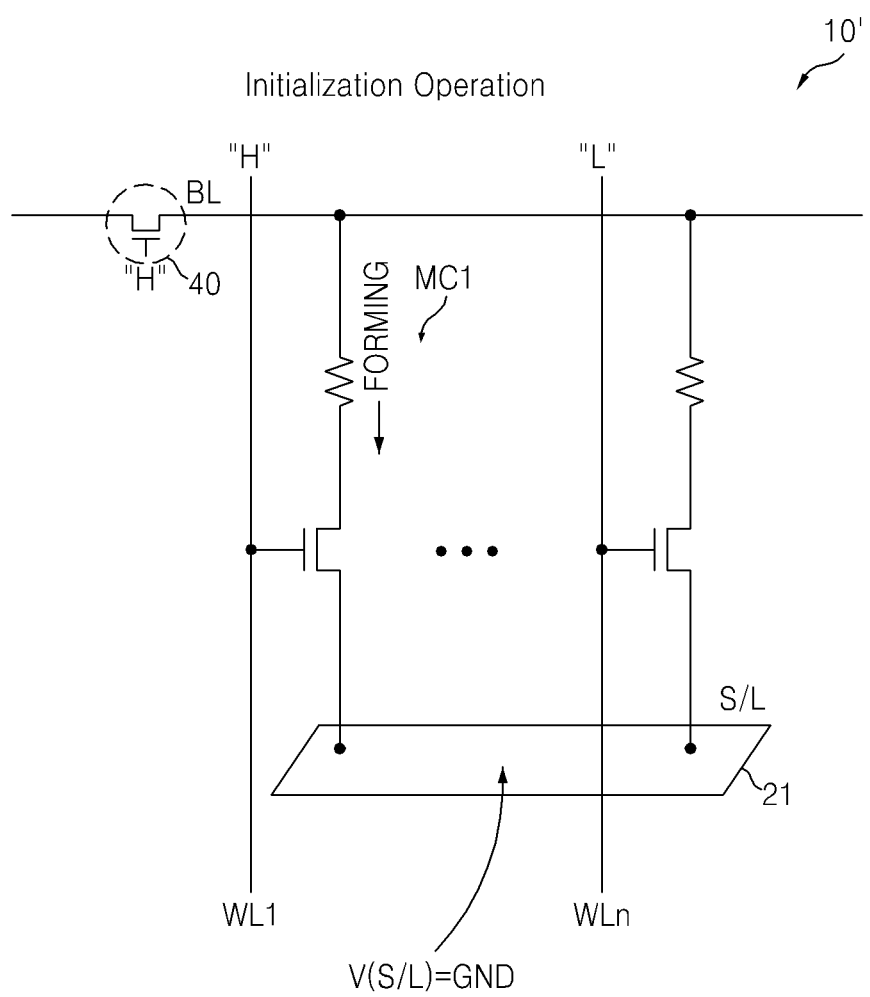
FIG. 10 is a circuit diagram illustrating an initialization method performed using a normal path of the resistive memory device shown in FIG. 8.
Figure 11:
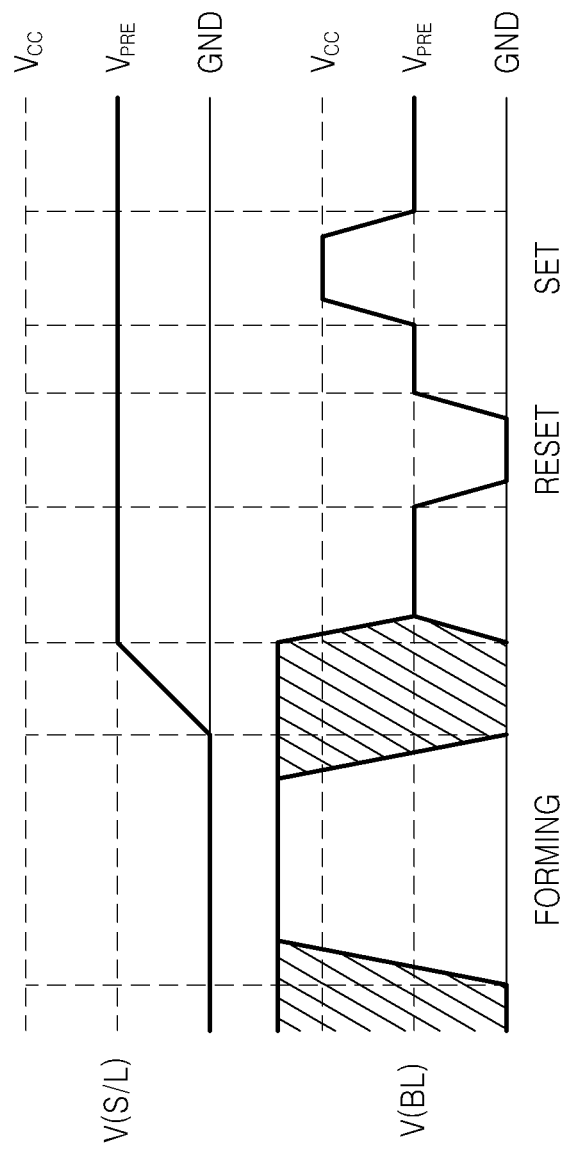
FIG. 11 is a waveform diagram illustrating a voltage supplied to each source line and bit line in the circuit diagrams of FIGS. 9 and 10.

FIG. 9 is a circuit diagram further illustrating a write operation performed using the normal path of the resistive memory device illustrated in FIG. 8. FIG. 10 is an analogous circuit diagram further illustrating an initialization operation performed by using the normal path of the resistive memory device illustrated in FIG. 8. FIG. 11 is a waveform diagram illustrating the voltage supplied to each of a source line and a bit line during the operations described in relation to FIGS. 9 and 10.

Referring collectively to FIGS. 8 to 11, a selection switch 40 is turned-on in response to a high selection signal during a normal operation. Accordingly, a sense amplifier & I/O circuit 28 may write/program "write data" to a first resistive memory cell MC1 through a bit line BL during a write operation, or may receive "read data" from the first resistive memory device MC1 through a bit line BL and may sense-amplify a received read data signal.

During the normal write operation illustrated in FIG. 9, when a voltage V(BL)=GND supplied to a bit line BL is less than a voltage V(S/L)=VPRE supplied to a common source line S/L and a high word line driving voltage is supplied only to a first word line WL1, memory resistor of a first resistive memory cell MC1 enters a reset state RESET.

However, during the normal write operation, when a voltage V(BL)=Vcc supplied to a bit line is greater than a voltage V(S/L)=VPRE supplied to a common source line S/L and a high word line driving voltage is supplied only to a first word line WL1, memory resistor of a first resistive memory cell MC1 enters a set state SET. Here, GND is ground voltage, Vcc is a supply voltage supplied to the resistive memory device 1', and VPRE a voltage greater than ground voltage GND but less than the supply voltage Vcc. In certain embodiments, VPRE may be ½ of Vcc.

When a voltage greater than the supply voltage Vcc is supplied to a bit line BL, ground voltage GND is supplied to a common source line S/L, and a high word line driving voltage is supplied only to a first word line WL1, memory resistor of a first resistive memory cell MC1 is initialized.

As explained referring to FIGS. 8 to 11, the resistive memory device 1' may initialize the memory resistor of a resistive memory cell by using a normal path by supplying a ground voltage GND to a common source line S/L.

Figure 12:
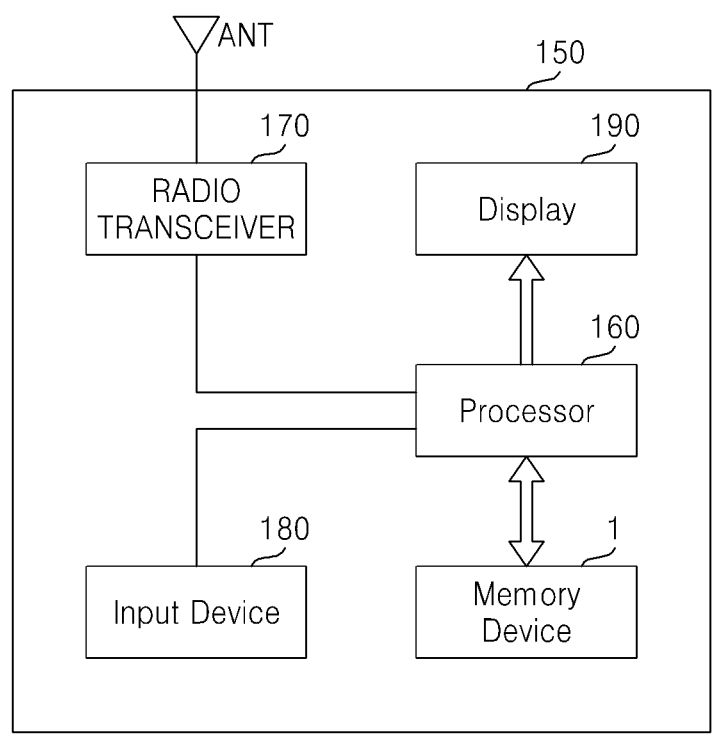
FIG. 12 is a general block system diagram of an electronic device incorporating a resistive memory device such as the one shown in FIG. 1.

FIG. 12 shows an embodiment of an electronic device including a resistive memory device illustrated in FIG. 1. Referring to FIG. 12, the electronic device 150 which may be embodied in a cellular phone, a smart phone, tablet personal computer, or a wireless communication device like an internet device includes a memory device (hereinafter: 1 of FIG. 1 and 1' of FIG. 8 are all called 1) and a processor 160 controlling an operation of the memory device 1, e.g., a write operation, a read operation or an initialization operation of the resistive memory device 1' illustrated in FIG. 8.

FIG. 12 illustrates that the processor 160 includes a function of a memory controller, however, the memory controller controlling the operation of a memory device 1 under a control of the processor 160 may be embodied between the processor 160 and the memory device 1 according to an example embodiment. Accordingly, the processor 160 or the memory controller may perform a function of a control device controlling an operation of a memory device 1.

Data stored in the memory device 1 may be displayed through a display 190 under a control of the processor 160 or the memory controller.

A wireless transceiver 170 may receive or transmit wireless signals through an antenna ANT. For example, the wireless transceiver 170 may change a wireless signal received through the antenna ANT into a signal that the processor 160 may process. Accordingly, the processor 160 may process a signal output from the wireless transceiver 170 and store a processed signal in the memory device 1 or display it through a display 190. Additionally, the wireless transceiver 170 may convert a signal output from the processor 160 into a wireless signal and output a converted wireless signal to outside through the antenna ANT.

An input device 180 is a device inputting data to be processed by control signals for controlling an operation of the processor 160 or the processor 160 and may be embodied in a pointing device such as a touch pad and a computer mouse, a keypad or a keyboard.

The processor 160 may control an operation of a display 190 so that data output from a memory device 1, a wireless signal output from the wireless transceiver 170 or data output from the input device 180 may be displayed through the display 190.

Figure 13:
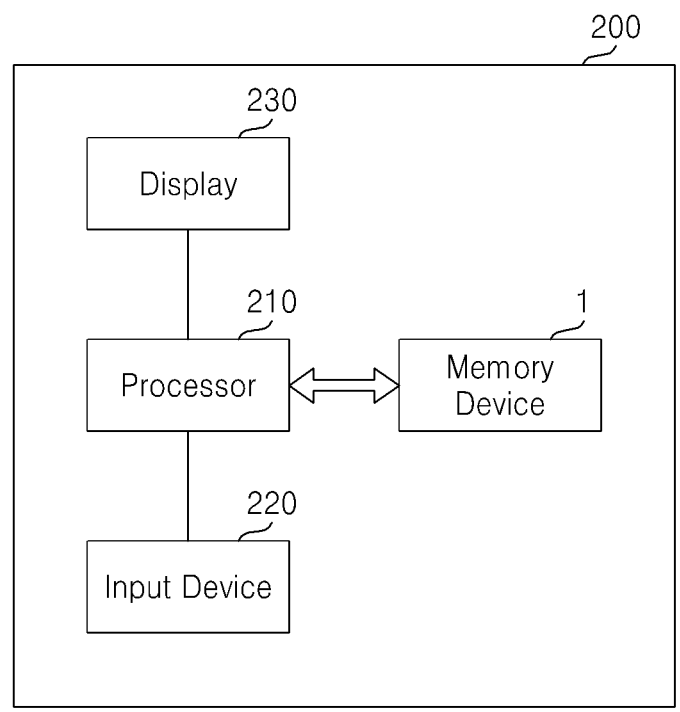
FIG. 13 is a general block system diagram of another electronic device incorporating a resistive memory device such as the one shown in FIG. 1.

FIG. 13 shows another embodiment of an electronic device including a resistive memory device illustrated in FIG. 1. Referring to FIG. 13, the electronic device 200, which may be embodied in a data processing device such as a personal computer (PC), a tablet PC, a laptop computer, a net-book, an e-reader, a personal digital assistant (PDA), a portable multimedia player (PMP), a MP3 player or a MP4 player, includes a memory device 1 and a processor 210 controlling an operation of the memory device 1.

The processor 210 is illustrated to include a function of a memory controller in FIG. 13, however, there may be embodied the memory controller, which may control the operation of the memory device 1 under a control of the processor 210, between the processor 210 and the memory device 1 according to an example embodiment.

The processor 210 may display data stored in the memory device 1 through a display 230 according to an input signal generated by an input device 220. For example, the input device 220 may be embodied in a pointing device such as a touch pad or a computer mouse, a keypad or a keyboard.

Figure 14:
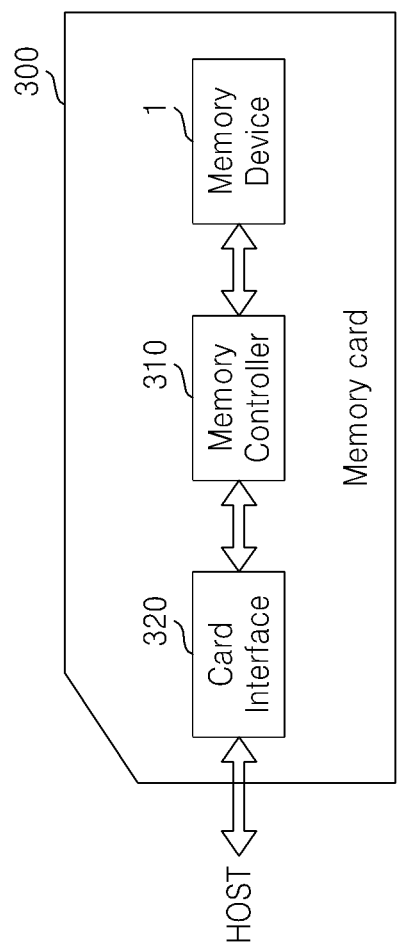
FIG. 14 is a block diagram of a memory card incorporating a resistive memory device such as the one shown in FIG. 1.

FIG. 14 shows still another embodiment of an electronic device including the resistive memory device illustrated in FIG. 1. Referring to FIG. 14, the electronic device 300 which may be embodied in a memory card or a smart card includes a memory device 1, a memory controller 310 and a card interface 320. The memory controller 310 may control data exchange between the memory device 1 and the card interface 320.

According to foregoing embodiments, the card interface 320 may be a secure digital (SD) card interface, a multi-media card (MMC) interface, a universal serial bus (USB) interface or an interChip (IC)-USB interface, however, it is not restricted thereto. The card interface 320 may interface data exchange between a host and a memory controller 310 according to a communication protocol of a host which may communicate with the electronic device 300. The interface may mean hardware or software.

When the electronic device 300 is connected to a host such as a digital camera, a digital audio player, a cellular phone, console video game hardware or a digital set-top box, the host may transmit or receive data stored in the memory device 1 through the card interface 320 and the memory controller 310.

Figure 15:
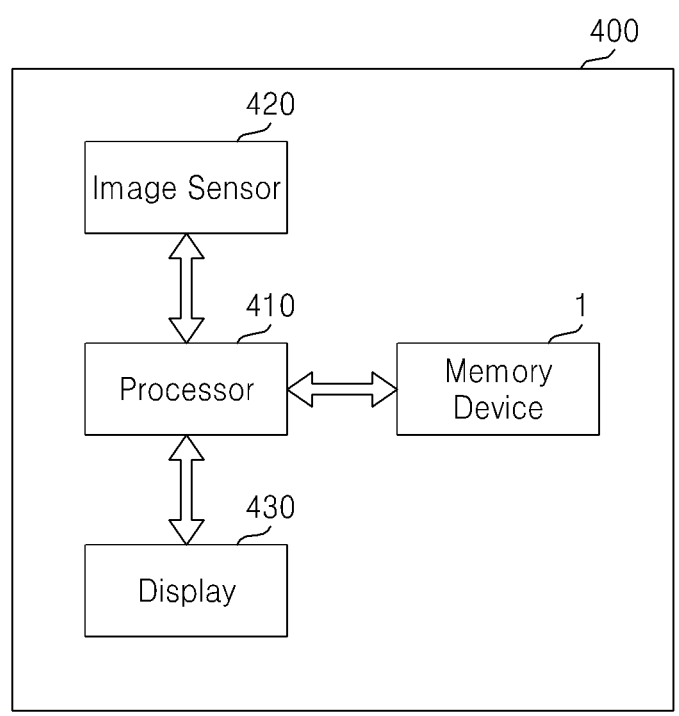
FIG. 15 is a general block system diagram of yet another electronic device incorporating a resistive memory device such as the one shown in FIG. 1.

FIG. 15 shows still another embodiment of an electronic device including the resistive memory device illustrated in FIG. 1. Referring to FIG. 15, the electronic device 400 includes a memory device 1 and a processor 410 controlling a data processing operation of the memory device 1. The processor 410 is illustrated to include a function of a memory controller in FIG. 15, however, there may be embodied the memory controller controlling the operation of the memory device 1 under a control of the processor 410 between the processor 410 and the memory device 1 according to an example embodiment.

An image sensor 420 of the electronic device 400 converts an optical image into a digital signal, and a converted digital signal is stored in a memory device 1 under a control of the processor 410 or displayed through a display 430. In addition, the digital signal stored in the memory device 1 is displayed through the display 430 under a control of the processor 410.

Figure 16:
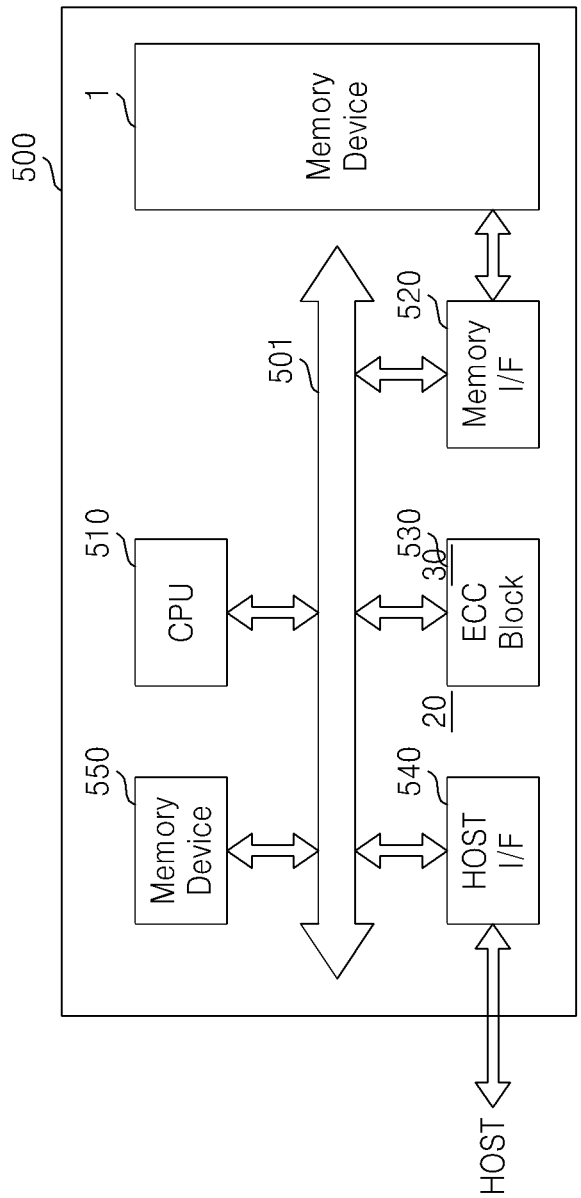
FIG. 16 is a general block system diagram of yet another electronic device incorporating a resistive memory device such as the one shown in FIG. 1.

FIG. 16 shows still another embodiment of an electronic device including the resistive memory device illustrated in FIG. 1. Referring to FIG. 16, the electronic device 500 includes a memory device 1 and a CPU 510 controlling an operation of the memory device 1.

The electronic device 500 includes a memory device 550 which may be used as an operation memory of a CPU 510. The memory device 550 may be embodied in a non-volatile memory such as ROM. A host connected to the electronic device 500 may transmit or receive data with the memory device 1 through a memory interface 520 and a host interface 540.

An error correction code (ECC) block 530 operating according to a control of the CPU 510 may detect and correct an error included in data read by the memory device 1 through a memory interface 520. The CPU 510 may control data exchange among a memory interface 520, an ECC block 530, a host interface 540 and a memory device 550 through a bus 501. The electronic device 500 may be embodied in a universal serial bus (USB) memory drive or a memory stick.

Figure 17:
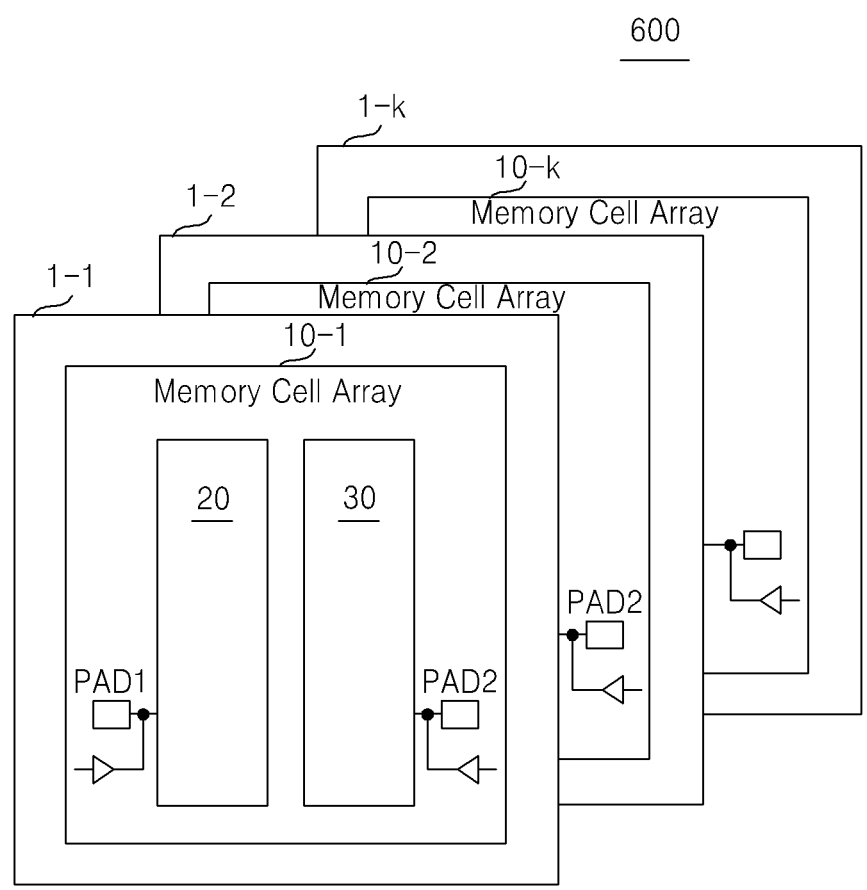
FIG. 17 is a block diagram illustrating in relevant portion a three-dimensional memory device incorporating a resistive memory device such as the one shown in FIG. 1.

FIG. 17 is a schematic block diagram illustrating a three-dimensional memory device including a resistive memory device according to an embodiment of the inventive concept. Referring to FIG. 17, a three-dimensional memory device 600 includes a plurality of resistive memory devices 1-1 to 1-k formed on different layers.

A plurality of resistive memory devices 1-1 to 1-k, where k is a natural number, may be embodied in a wafer stack, a chip stack, or a cell stack. An electric connection between layers may use a through silicon via (TSV), a wire bonding or a bump.

Architecture of each of the plurality of resistive memory devices 1-1 to 1-k is substantially the same as architecture of the resistive memory device 1 illustrated in FIG. 1. That is, each memory cell array 10-1 to 10-k embodied in each resistive memory device 1-1 to 1-k of a wafer stack or a chip stack includes two plates 20 and 30, and a first initialization pad PAD1 and a second initialization pad PAD2 which are installed in each of two plates 20 and 30.

Figure 18:
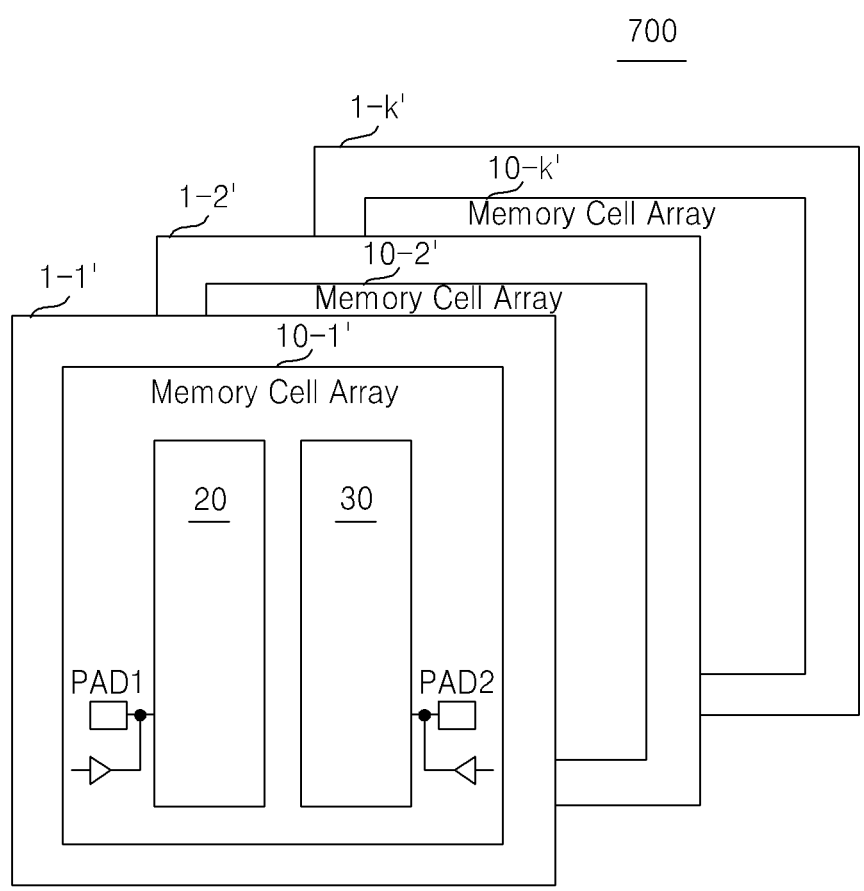
FIG. 18 is a block diagram illustrating in relevant portion another three-dimensional memory device incorporating a resistive memory device such as the one shown in FIG. 1.

FIG. 18 is a schematic block diagram illustrating a three-dimensional memory device including a resistive memory device according to another embodiment of the inventive concept. Referring to FIG. 18, a three-dimensional memory device 700 includes a plurality of resistive memory device 1-1' to 1-k' formed on different layers.

A plurality of resistive memory devices 1-1' to 1-k', where k is a natural number, are embodied in a cell stack. Each resistive memory device 1-1' to 1-k' includes each memory cell array 10-1' to 10-k'. One of the plurality of resistive memory devices 1-1' to 1-k', e.g., a resistive memory device 1-1', has substantially the same architecture as the resistive memory device 1 illustrated in FIG. 1. Accordingly, a memory cell array 10-1' embodied in the resistive memory device 1-1' includes two plates 20 and 30, and a first initialization pad PAD1 and a second initialization pad PAD2 connected to each of the two plates 20 and 30.

Architecture of each of the rest resistive memory devices 1-2' to 1-k' except for the resistive memory device 1-1' is substantially the same as architecture of a memory cell array illustrated in FIG. 2 except for each initialization pad PAD1 or PAD2.

A resistive memory device according to embodiments of the inventive concept may initialize one or more resistive memory cells quickly using either an initialization path outside a normal path or within the normal path.

Although a few embodiments of the present general inventive concept have been shown and described, it will be appreciated by those skilled in the art that changes may be made in these embodiments without departing from the scope of the inventive concept as defined by the following claims and their equivalents.

What is claimed is:

1. A resistive memory device comprising:
a memory cell array arranging resistive memory cells according to a plurality of word lines and a plurality of bit lines, wherein a first group of resistive memory cells is connected between the plurality of bit lines and a first plate and a second group of resistive memory cells is connected between the plurality of bit lines and a second plate;
a first initialization pad that receives a first initialization voltage from an initialization device external to the resistive memory device and provides the first initialization voltage to the first plate during an initialization operation;
a second initialization pad that receives a second initialization voltage from the initialization device and provides the second initialization voltage to the second plate during the initialization operation,
wherein the first and second initialization voltages are respectively applied to the first and second plates outside a normal path associated with a normal operation of the resistive memory cells.

2. The resistive memory device of claim 1, further comprising:
a first driver connected to the first plate and being enabled/disabled in response to a first control signal; and
a second driver connected to the second plate and being enabled/disabled in response to a second control signal.

3. The resistive memory device of claim 2, wherein the first driver and the second driver are disabled during the initialization operation; and
the first driver and the second driver are enabled during the normal operation to respectively supply a same voltage to the first plate and the second plate.

4. The resistive memory device of claim 1, further comprising:
a sense amplifier and input/output (I/O) circuit connected via the normal path to at least one of the plurality bit lines during the normal operation, and disconnected from each and every one of the plurality of bit lines during the initialization operation, such that the first and second initialization voltages are directly and respectively applied to the first and second plates outside the normal path.

5. The resistive memory device of claim 4, further comprising:
selection switches respectively associated with each one of the plurality of bit lines to selectively connect the at least one of the plurality bit lines to the sense amplifier and I/O circuit during the normal operation, and disconnect each and every one of the plurality of bit lines from the sense amplifier and I/O circuit during the initialization operation.

6. The resistive memory device of claim 1, further comprising:
a driver that generates a normal voltage applied to the memory cell array during the normal operation; and
a switch circuit that connects the driver to at least one of the first plate and the second plate during the normal operation and disconnects the driver from the first plate and the second plate during the initialization operation.

7. The resistive memory device of claim 1, further comprising:
a first plurality of transistors respectively connecting the first group of resistive memory cells to the first plate; and
a second plurality of transistors respectively connecting the second group of resistive memory cells to the second plate.

8. The resistive memory device of claim 7, wherein the first plurality of transistors and the second plurality of transistors are operated similarly, such that during the initialization operation, one of the first plurality of transistors connected to a selected bit line is turned-on simultaneously with one of the second plurality of transistors connected to the selected bit line.

9. The resistive memory device of claim 8, wherein one of the first plurality of transistors is connected in series with the one of the second plurality of transistors during the initialization operation.

10. The resistive memory device of claim 7, wherein the first plurality of transistors and the second plurality of transistors are operated complementarily, such that during the initialization operation, one of the first plurality of transistors connected to a selected bit line is turned-on while one of the second plurality of transistors connected to the selected bit line is turned-off.

11. The resistive memory device of claim 1, wherein the plurality of bit lines, the first plate and the second plate are arranged in parallel with one another in the resistive memory device.

* * * * *